US007738081B2

(12) United States Patent
Jacobs

(10) Patent No.: US 7,738,081 B2
(45) Date of Patent: Jun. 15, 2010

(54) LITHOGRAPHIC APPARATUS AND DEVICE MANUFACTURING METHOD UTILIZING A FLAT PANEL DISPLAY HANDLER WITH CONVEYOR DEVICE AND SUBSTRATE HANDLER

(75) Inventor: Hernes Jacobs, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1041 days.

(21) Appl. No.: 11/123,232

(22) Filed: May 6, 2005

(65) Prior Publication Data

US 2006/0252270 A1 Nov. 9, 2006

(51) Int. Cl.
*G03B 27/60* (2006.01)
(52) U.S. Cl. .............................. 355/73; 355/72; 414/941
(58) Field of Classification Search .................... 355/72, 355/75, 73, 53; 414/935, 941
See application file for complete search history.

(56) References Cited

U.S. PATENT DOCUMENTS

| 4,832,474 | A | * | 5/1989 | Yoshinaga et al. .......... 359/392 |
| 5,229,872 | A | | 7/1993 | Mumola |
| 5,296,891 | A | | 3/1994 | Vogt et al. |
| 5,500,736 | A | | 3/1996 | Koitabashi et al. |
| 5,523,193 | A | | 6/1996 | Nelson |
| 5,530,482 | A | | 6/1996 | Gove et al. |
| 5,579,147 | A | | 11/1996 | Mori et al. |
| 5,677,703 | A | | 10/1997 | Bhuva et al. |
| 5,808,797 | A | | 9/1998 | Bloom et al. |
| 5,848,868 | A | * | 12/1998 | Suzuki et al. .......... 414/416.03 |
| 5,967,159 | A | * | 10/1999 | Tateyama .................... 134/61 |
| 5,982,553 | A | | 11/1999 | Bloom et al. |
| 6,133,986 | A | | 10/2000 | Johnson |
| 6,177,980 | B1 | | 1/2001 | Johnson |
| 6,687,041 | B1 | | 2/2004 | Sandstrom |
| 6,747,783 | B1 | | 6/2004 | Sandstrom |
| 6,781,669 | B2 | * | 8/2004 | Tanaka ....................... 355/53 |

(Continued)

FOREIGN PATENT DOCUMENTS

JP 2004284772 * 10/2004

(Continued)

OTHER PUBLICATIONS

U.S. Appl. No. 11/067,671, filed Mar. 1, 2005, Robert-Han Munnig Schmidt.

(Continued)

*Primary Examiner*—Peter B Kim
*Assistant Examiner*—Chia-how Michael Liu
(74) *Attorney, Agent, or Firm*—Sterne, Kessler, Goldstein & Fox, P.L.L.C

(57) ABSTRACT

A lithographic apparatus can include an illumination system that conditions a radiation beam, a patterning device that modulates the radiation beam, a substrate table that supports a substrate, and a projection system that projects the modulated radiation beam onto a target portion of the substrate. The lithographic apparatus can also include a substrate handler that loads and/or unloads a substrate on/from the substrate table. The substrate handler supports the substrate in a support plane and can include a conveyor device for moving the substrate in a direction substantially parallel to the support plane. The conveyor device can include a gripping device configured to push or pull the substrate in the indicated direction and a driving device for driving the gripping device in the indicated direction.

9 Claims, 6 Drawing Sheets

U.S. PATENT DOCUMENTS

| | | |
|---|---|---|
| 6,795,169 B2 | 9/2004 | Tanaka et al. |
| 6,806,897 B2 | 10/2004 | Kataoka et al. |
| 6,811,953 B2 | 11/2004 | Hatada et al. |
| 6,841,033 B2 * | 1/2005 | Condrashoff et al. .. 156/345.31 |
| 7,242,458 B2 | 7/2007 | Munnig Schmidt |
| 2001/0006763 A1 * | 7/2001 | Tanaka ....................... 430/311 |
| 2004/0041104 A1 | 3/2004 | Liebregts et al. |
| 2004/0130561 A1 | 7/2004 | Jain |
| 2005/0007572 A1 | 1/2005 | George et al. |
| 2006/0139616 A1 | 6/2006 | Jacobs et al. |
| 2006/0158634 A1 * | 7/2006 | Jacobs et al. .................. 355/67 |

FOREIGN PATENT DOCUMENTS

| | | |
|---|---|---|
| WO | WO 98/33096 | 7/1998 |
| WO | WO 98/38597 | 9/1998 |

OTHER PUBLICATIONS

U.S. Appl. No. 11/157,201, filed Jun. 21, 2005, Jacobs et al.

* cited by examiner

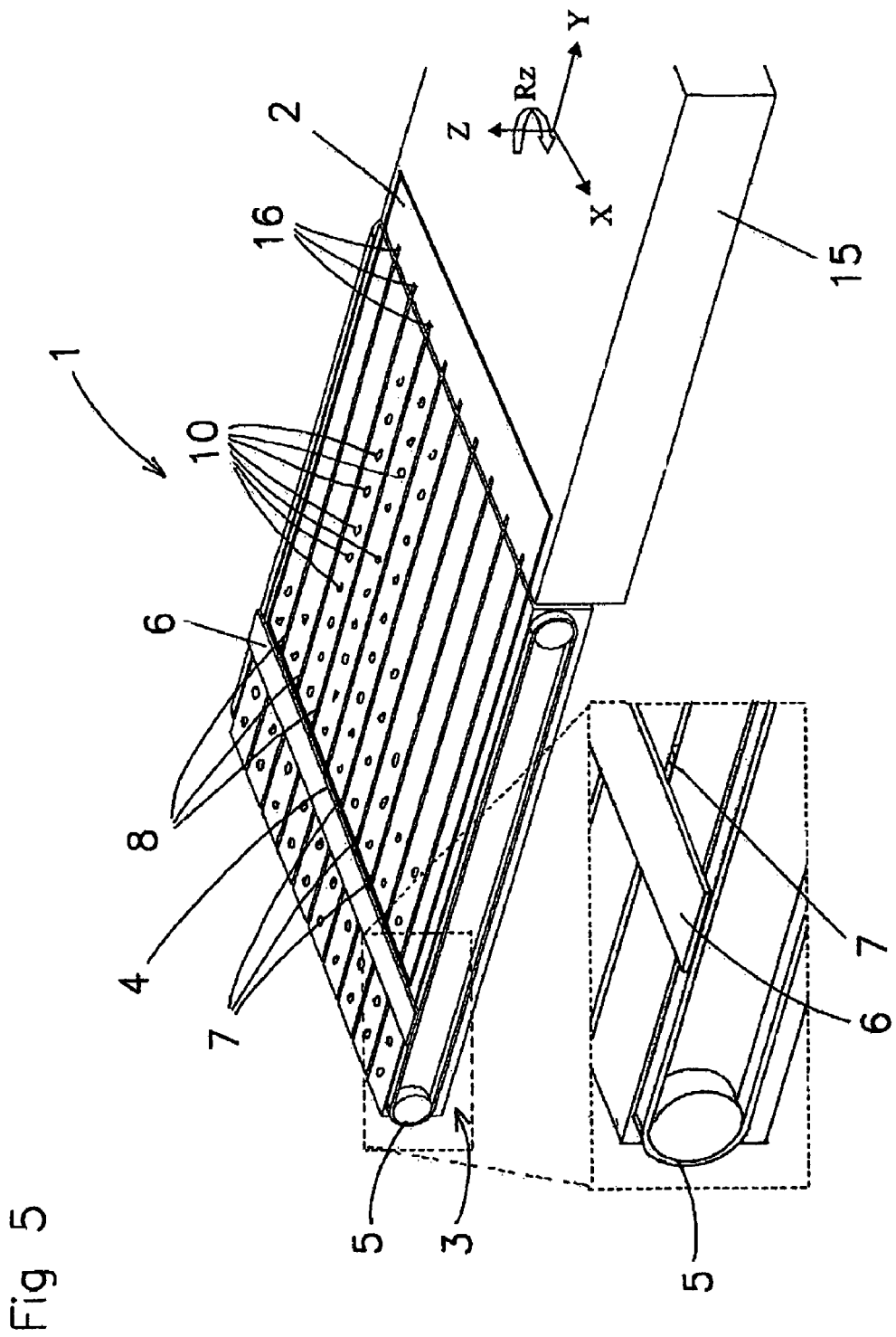

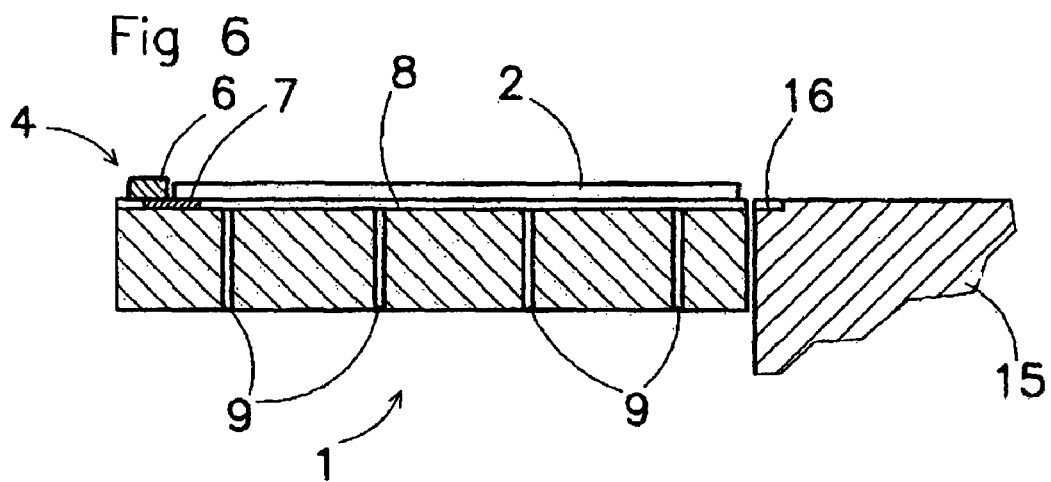
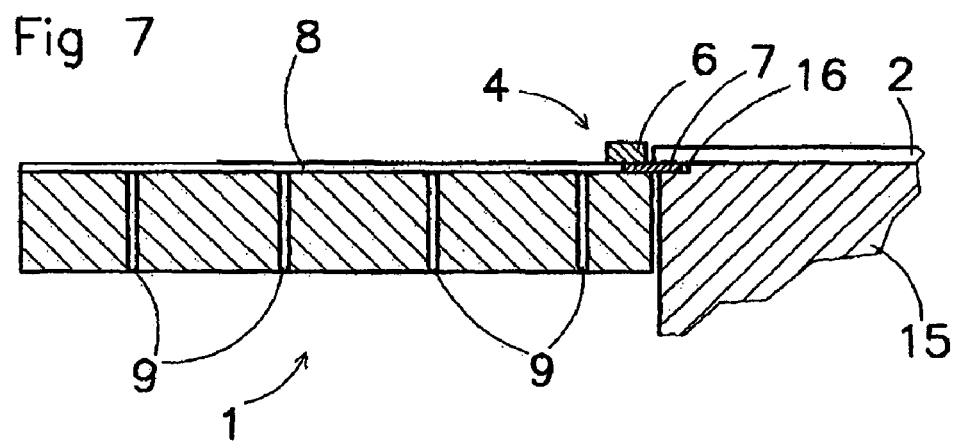

LITHOGRAPHIC APPARATUS AND DEVICE MANUFACTURING METHOD UTILIZING A FLAT PANEL DISPLAY HANDLER WITH CONVEYOR DEVICE AND SUBSTRATE HANDLER

BACKGROUND

1. Field

The present invention relates to a lithographic apparatus and a method for manufacturing a device.

2. Background

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred on (part of) the substrate (e.g., a glass plate), e.g., via imaging onto a layer of radiation-sensitive material (resist) provided on the substrate.

Instead of a circuit pattern, the patterning means can be used to generate other patterns, for example a color filter pattern, or a matrix of dots. Instead of a mask, the patterning device can comprise a patterning array that comprises an array of individually controllable elements. An advantage of such a system compared to a mask-based system is that the pattern can be changed more quickly and for less cost.

A flat panel display substrate can be rectangular in shape. Lithographic apparatus designed to expose a substrate of this type can provide an exposure region that covers a full width of the rectangular substrate, or that covers a portion of the width (for example half of the width). The substrate can be scanned underneath the exposure region, while the mask or reticle is synchronously scanned through the projection beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

For loading and/or unloading a substrate on the substrate table on which the substrate is supported during exposure of a pattern on the substrate, the known lithographic apparatus comprises a substrate handler. A substrate handler for a lithographic apparatus comprises a robot which places the substrate on the substrate table. As it is undesirable to contact the substrate at the upper side, the substrate table is provided with lifting pins that can be moved in and out of the substrate table in a substantial vertical direction. In a retracted position the pins are retracted in the substrate table so that the substrate can rest on a support surface of the substrate table. In a lifted position of the lifting pins a substrate can be held in an exchange position, in which the forks or other holding elements of a robot can be placed under the bottom side of the substrate, so that the substrate can be taken over by the robot, or vice versa, without contacting the top side of the substrate.

In this known substrate handler separate lifting means have to be provided in the substrate table in order to make exchange of a substrate possible. It is undesirable to have a loading/unloading mechanism on the substrate table, since such additional means on the substrate table can have a negative influence on the final product quality. Furthermore, the use of lifting means requires a considerable amount of space above the substrate table, which space is required for other components of the lithographic apparatus, such as in particular a lens column.

Therefore, what is needed is a system and method that provide a substrate handler for loading and/or unloading a substantially flat substrate on/from a substrate table, where the substrate table comprises relative small adaptations for the loading and unloading of substrates. Another aspect of the invention is to provide a substrate handler that requires a relatively small space above the substrate table to load and/or unload a substrate on/from substrate table.

SUMMARY

In one embodiment, there is provided a lithographic apparatus comprising an illumination system configured to condition a radiation beam, a patterning device capable of modulating the cross-section of the radiation beam, a substrate table constructed to support a substrate, and a projection system configured to project the modulated radiation beam onto a target portion of the substrate. The lithographic apparatus comprises a substrate handler configured to load and/or unload a substrate on/from the substrate table. The substrate handler is configured to support the substrate in a support plane and comprises a conveyor device for moving the substrate in a direction substantially parallel to the support plane. The conveyor device comprises a gripping device configured to push or pull the substrate in the direction and a driving device for driving the gripping device in the direction.

In one embodiment, there is provided a device manufacturing method comprising projecting a patterned beam of radiation onto a substrate, wherein the substrate is supported on a substrate support during projection. The method also comprises the use of a substrate handler for loading and/or unloading a substrate on/from the substrate table, the substrate handler configured to support the substrate in a support plane and comprising a conveyor device for moving the substrate in a direction substantially parallel to the support plane. The conveyor device comprises a gripping device configured to push or pull the substrate in the direction and a driving device for driving the gripping device in the direction.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIG. 5 depicts a substrate handler, according to one embodiment of the present invention.

FIGS. 6 and 7 depict schematically the substrate handler of FIG. 5 in cross section, according to one embodiment of the present invention.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1:
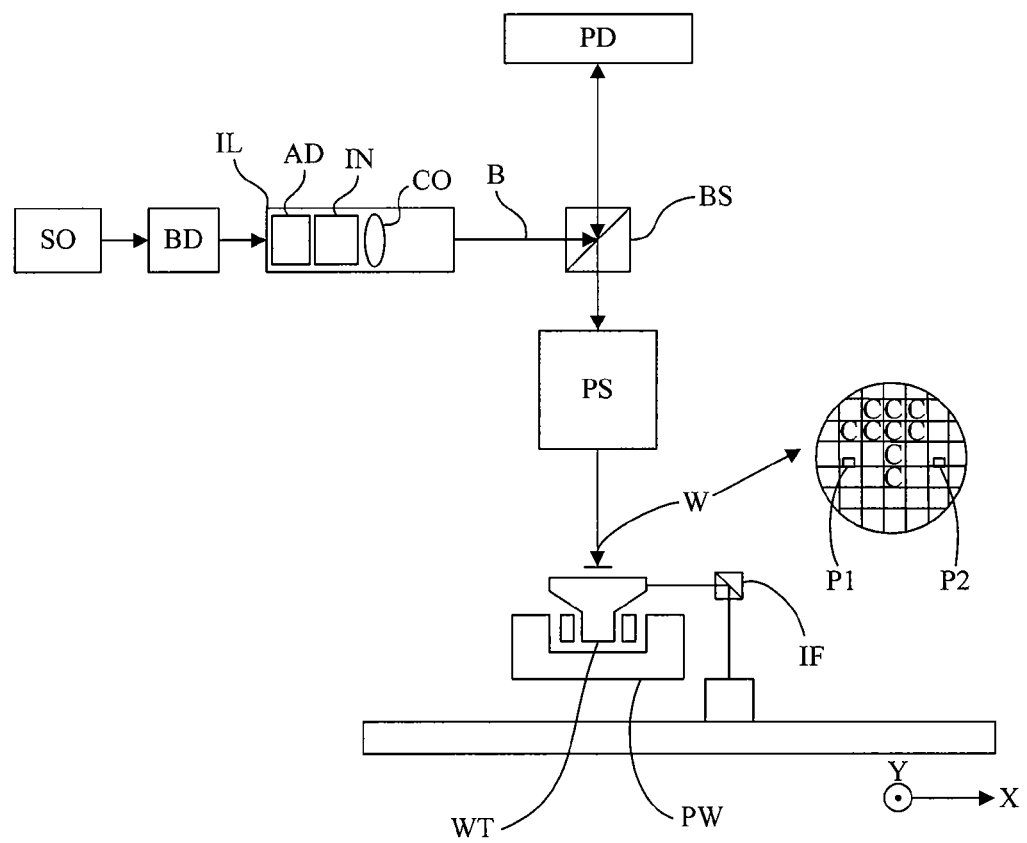
FIGS. 1 and 2 depict lithographic apparatus, according to various embodiments of the present invention.

FIG. 1 schematically depicts a lithographic apparatus according to one embodiment of the invention. The apparatus comprises an illumination system EL, a patterning device PD, a substrate table WT, and a projection system PS.

The illumination system (illuminator) EL is configured to condition a radiation beam B (e.g., UV radiation).

The patterning device PD (e.g., an array of individually controllable elements) modulates the projection beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device," used herein should be broadly interpreted as referring to any device that can be used to modulate the cross-section of a radiation beam, such as to create a pattern in a target portion of the substrate. It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference in their entirety.

Another example PD is a programmable LCD array. An example of such a construction is given in U.S. Pat. No. 5,229,872, which is incorporated herein by reference in its entirety.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

In example where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm.

In examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In an embodiment, the substrate is a ceramic substrate. In one example, the substrate is a glass substrate. In one example, the substrate is a plastic substrate. In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 µm, e.g., at least 100 µm, at least 200 µm, at least 300 µm, at least 400 µm, at least 500 µm, or at least 600 µm. In one example, the thickness of the substrate is at most 5000 µm, e.g., at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

Figure 2:
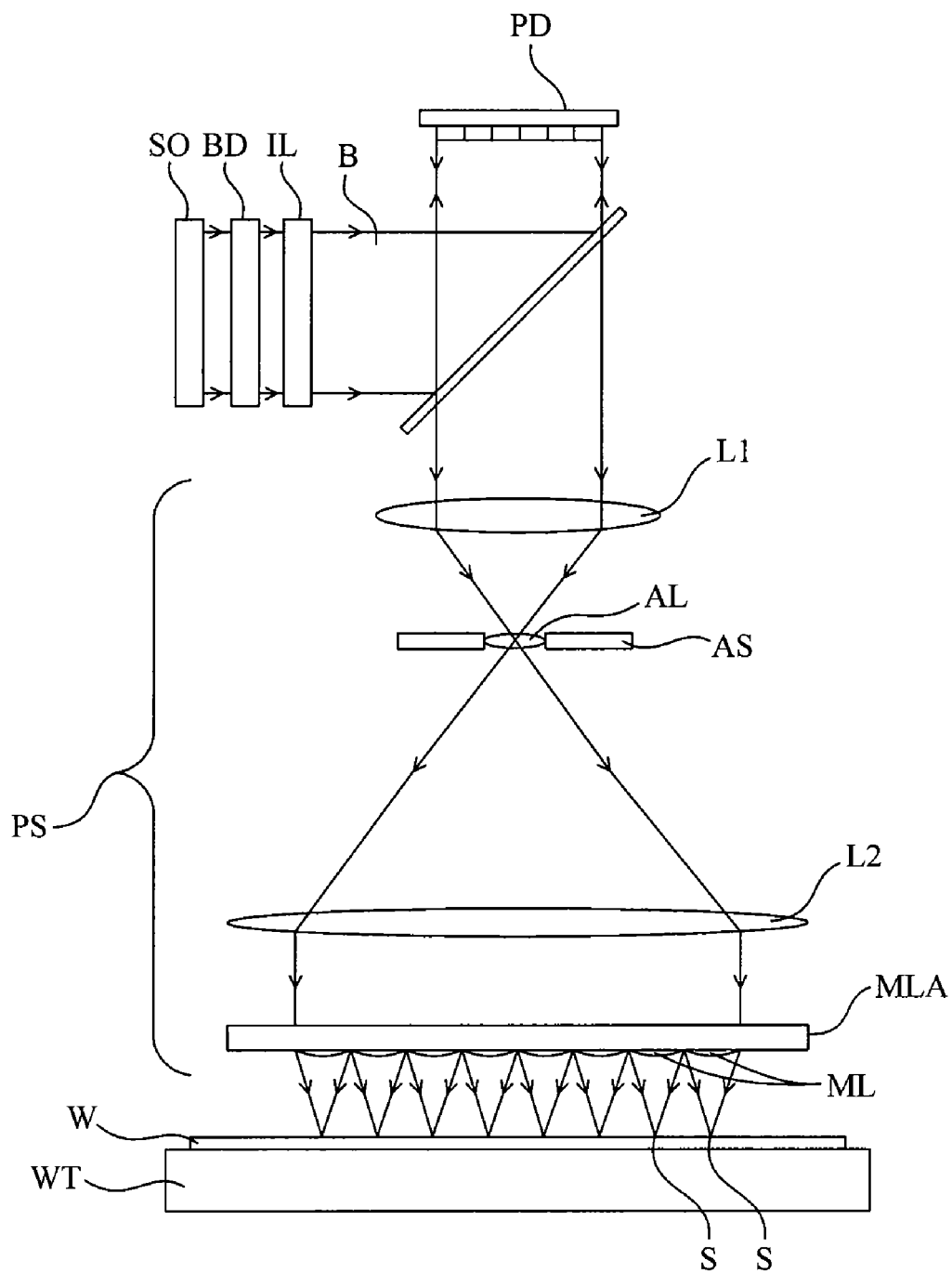

As herein depicted in FIGS. 1 and 2, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In one example, the apparatus is absent at least a short stroke module for moving substrate table WT. A similar system can also be used to position the array of individually controllable elements. It will be appreciated that the projection beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmissive patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the projection beam B is caused to scan a line across the substrate W. The pattern on the array of individually controllable elements is updated as required between pulses of the radiation system and the pulses are timed such that successive target portions C are exposed at the required locations on the substrate W. Consequently, the projection beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the projection beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

FIG. 2 depicts an arrangement of a lithographic apparatus, according to one embodiment of the present invention. This embodiment can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation beam B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
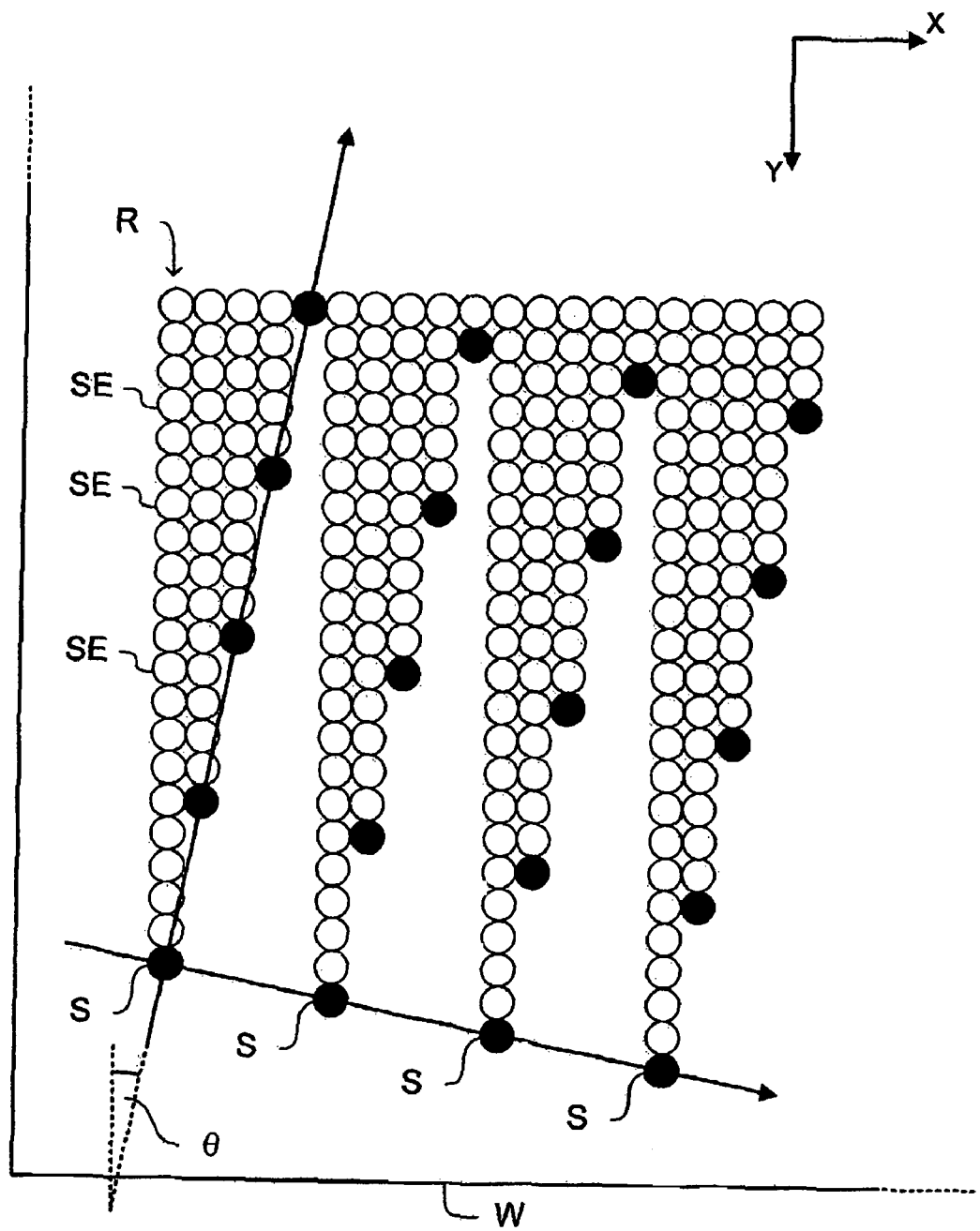
FIG. 3 depicts a mode of transferring a pattern to a substrate using an embodiment of the invention as show in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle θ is at most 20°, 10°, e.g., at most 5°, at most 3°, at most 1°, at most 0.5°, at most 0.25°, at most 0.10°, at most 0.05°, or at most 0.01°. In one example, the angle θ is at least 0.001°.

Figure 4:
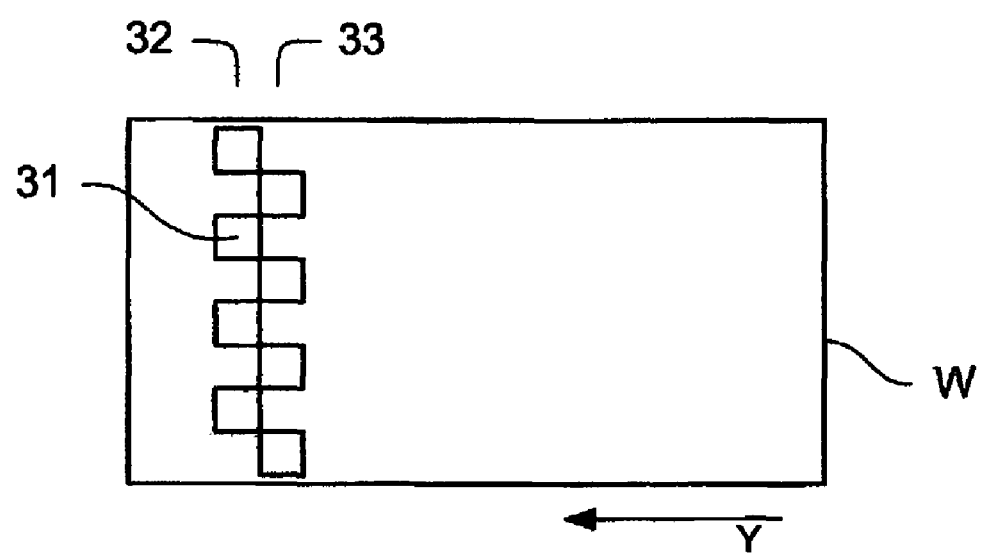
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays 31 of radiation spots S are produced by eight optical engines (not shown), arranged in two rows 32, 33 in a 'chess board' configuration, such that the edge of one array of radiation spots S slightly overlaps (in the scanning direction Y) with the edge of the adjacent array of radiation spots 15. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

FIG. 5 shows a substrate handler 1, according to one embodiment of the present invention. FIGS. 6 and 7 shows cross-sections of the substrate handler 1, according to various embodiments of the present invention.

The substrate handler 1 is configured to load and/or unload a substantially flat substrate 2 on or from a substrate table 15. The substrate handler 1 is schematically shown in cross-section in FIGS. 6 and 7, whereby in FIG. 6 the substrate is mainly supported on the substrate handler 1, and in FIG. 7 the substrate is mainly supported on the substrate table 15.

The substrate handler 1 comprises a support surface to support the substantially flat substrate 2. This support surface defines a support plane in which the substrate 2 is supported. This support plane can be configured by the support surface itself, for instance when the substrate lies directly on the support surface of the substrate handler. For example, this is the case when no mechanical friction reducing means, such as rollers, wheels or a conveyor belt, are provided. The support plane can also be defined as the plane wherein the substrate 2 is supported when the friction is reduced by an air bed or other float means. The support plane is in general defined as the plane in which the substantially flat substrate is held by the substrate handler 1 when the substrate handler 1 loads or unloads a substrate on or from the substrate table 15. This support plane is usually a substantially horizontal plane.

The substrate handler 1 comprises a conveyor device 3 for moving a substrate in a plane substantially parallel to the support plane. As the support plane of the substrate handler 1 is substantially located in the same plane as the support surface/plane of the substrate table 15, usual a horizontal plane, the substrate 2 can with a movement in the indicated direction be pushed on or pulled from the substrate table 15. Since this movement is parallel to the support surface/plane of the substrate table 15, the substrate handler 1 does not require a considerable amount of space above the substrate table 15. This is advantageous as usually the lens column of the lithographic apparatus is located close above the substrate during projection of an image on this substrate. With the present substrate handler 1 it is possible to load and/or unload a substrate on/from the substrate table 15 without the requirement that the substrate table 15 is moved to a position wherein the lens is not anymore located above the substrate table 15. This makes the loading/unloading of substrates 2 more time-efficient, and less footprint is required for the combination of substrate handler 1 and substrate table 15.

The conveyor device 3 comprises a gripping device 4 and a driving device 5 for moving the gripping device 4. The gripping device 4 is configured to grip a substrate along one of the edges so that the substrate 2 can be moved by pushing and pulling while it stays in a defined position with respect to at least the moving part of the gripping device 4. As the substrate 2 is held at one of the edges, the substrate handler 1 is capable of pushing the substrate 2 completely on the substrate table 15, or pulling it therefrom, whereby there is no need to provide separate transport means on the substrate table 15.

Since the substrate 2 is actually fixedly gripped by the gripping device 4 the substrate 2 can during a loading/unloading movement be accelerated at a high rate as the position with respect to the gripping device 4 will be constant. This is an advantage with respect to friction substrate handler systems wherein the substrate 2 is moved on the basis of friction between the substrate 2 and a substrate moving device, such as a conveyor belt, actuated wheels or rolls. In these friction substrate handler systems the acceleration is limited due to the limited friction between substrate and substrate handler, which consequently results in a lower throughput.

The gripping device 4 comprises a beam 6 on which a number of vacuum fingers 7 are arranged. These vacuum fingers 7 are provided with holes (vacuum pads) that can be placed against the underside of the substrate 2. When the interior of the holes is placed in a vacuum by pumping the air out of the holes, the vacuum fingers 7 will grip the substrate. In one example, the vacuum fingers 7 are movable in a direction perpendicular to the support plane so that the vacuum fingers 7 can move towards the bottom surface of the substrate 2 when the holes are vacumized. The vacuum fingers 7 can be pivotably mounted on the beam 6.

The vacuum fingers 7 are located in grooves 8 which are provided in the support surface of the substrate handler 1 so that the vacuum fingers 7 are capable of gripping the underside of the substrate 2 without exerting a (lifting) force on the substrate 2 or having any other undesired influence on the position/shape of the substrate.

In an alternative embodiment, vacuum fingers 7 can be provided that are placed between the substrate and the support surface without the presence of any grooves 8 accommodating the vacuum fingers 7. In such embodiment, the vacuum fingers 7 are low so that placing the vacuum fingers 7 between the substrate and the support surface has a minimal influence on the shape of the substrate, and therewith stresses in the substrate.

Using grooves 8 in the support surface of the substrate table 15 can allow for at least a part of the substrate table 15 being provided with (partial) grooves 16 to make a full exchange between the substrate handler 1 and the substrate table 15. It can be desirable to keep the number and size (both length and width) of the vacuum fingers 7 small, so that a minimum of adaptations have to be made on the substrate table 15.

As can be seen in FIGS. 5, 6 and 7 only small grooves 16 have to be provided in the edge of the substrate table 15 to make a complete exchange of a substrate 2 between the substrate handler 1 and the substrate table 15 possible.

The adaptation of the substrate table 15 on the substrate handler 1 is relatively small compared to the substrate handler 1 using lifting pins in the substrate table 15 as described in the introduction of this application and the friction substrate handler systems described above, the latter requiring the presence of friction substrate moving devices, such as conveyor belts or actuated wheels or rolls, on the substrate table 15 to move the substrate on the substrate table 15.

In one example, instead of the vacuum fingers 7 other gripping means for gripping the substrate can be used, such as clamps. However, vacuum fingers 7 can be desirable as vacuum is suitable to grip a substrate while only having contact with one side of the substrate 2. This is of importance as it is not desirable to contact the both sides of the substrate as on one of these sides (usually the top side) an image is projected. This projection can be damaged when a gripping device 4 would contact this image.

The driving device 5 comprises a belt and two (gear) wheels on which the belt is mounted. The belt is connected with the beam 6 on which the vacuum fingers 7 are arranged. The driving device 5 can move the beam 6 towards the substrate table 15 to load a substrate on the substrate table 15 and away from the substrate table 15 to unload a substrate from the substrate table 15. In other examples, any known alternative driving device to drive the gripping device 4 can be used in the substrate handler 1. Possible suitable driving devices can include, but are not limited to, linear motors, hydraulic motors, pneumatic motors and such.

The substrate handler 1 can be provided with lifting means, such as the lifting pins 9 (shown in FIGS. 6 and 7), for exchanging a substrate between the substrate handler 1 and a robot (not shown). Such lifting pins 9 can lift a substrate from the support surface, so that forks or other holding elements of a robot can be brought under the substrate.

In one example, the robot can be used for transporting the substrate to and from a substrate loading station or any other (temporarily) storage station. Robots suitable to exchange a substrate with the substrate handler 1 are known in the art.

Substrate handler 1 is provided with a friction reducing device for reducing the friction between substrate and substrate handler 1. This friction reducing device comprises a number of small holes 10, in the support surface of substrate handler 1, which holes are connected with an air pump or other air supply device. It is to be appreciated that only a limited number of these holes are shown in FIG. 5, and that in practice the holes 10 are provided on the major part of the support surface. When the air pump is activated, air streams out of the holes so that an air bed is provided on which the substrate can be supported.

In another example, another type friction reducing device can be provided to reduce the friction between the substrate and the substrate handler 1. Such friction reducing device can comprise, but is not limited to, rollers, conveyor belts, wheels, or the like. However, an air bed can be desired as the use of a mechanical friction reducing device can lead to contamination and possibly to electrical discharge, in particular in the presence of rolling parts. Furthermore, the air holes can also be used to hold the substrate in a certain position with respect to the substrate handler 1 by using the air holes 10 as vacuum holes (vacuum pads), such as was described for the holes in the vacuum gripping device 4.

The friction reducing device can also be used to reduce the friction of the gripping device 4 on the substrate support. For instance, in the case of an air bed provided by air introduced through the holes 10 in the support surface, this air bed can also be for used to make a part of the gripping device 4, in particular the beam 6, floating on the substrate handler 1.

In order to reduce the friction between the substrate and the substrate table 15, the substrate table 15 can also be provided with a friction reducing device. In the shown embodiment the substrate table 15 is provided with similar holes as the substrate handler 1 so that the friction between substrate and substrate table 15 can be reduced by the provision of an air bed between the substrate and the substrate table 15. However, another type of friction reducing device can also be provided.

In the above description a substrate handler 1 is described for loading and/or unloading one substrate on/from the substrate table 15. However, the substrate handler according the invention can be used for simultaneously loading and/or unloading two or more substrates on/from the substrate table 15. Such two or more substrates can be transported on top or next to each other. The two or more substrates can be of different sizes and shapes. In a possible embodiment two substrates of half the size of the size of the substrate shown in FIG. 5, are simultaneously transported by the substrate handler 1, whereby the two substrates are located next to each other on the support surface of the substrate handler 1.

Example systems for transporting two or more substrates can be found in U.S. Ser. No. 11/067,671, filed Mar. 1, 2005, and U.S. Provisional Patent Application Nos. 60/638,171, filed Dec. 23, 2004, and 60/639,960, filed Dec. 30, 2005, which are all incorporated by reference herein in their entireties.

In the drawings only one substrate handler 1 is shown in combination with a substrate table 15. It can be possible to provide (two or more) substrate handlers in combination with one (or more). For instance, for one substrate table 15 one substrate handler can be provided for loading substrates on the substrate table 15 and another substrate handler can be provided for unloading substrates from the substrate table 15.

With such arrangement, a more efficient handling of the substrates and a higher throughput can be obtained.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus can be used to assist in the creation of a variety of layers, e.g., a thin film transistor layer and/or a color filter layer.

The term "lens," where the context allows, can refer to any one or combination of various types of optical components, including refractive, reflective, magnetic, electromagnetic, electrostatic, or the like optical components.

While specific embodiments of the invention have been described above, it will be appreciated that the invention can be practiced otherwise than as described. For example, the invention can take the form of a computer program containing one or more sequences of machine-readable instructions describing a method as disclosed above, or a data storage medium (e.g., semiconductor memory, magnetic or optical disk) having such a computer program stored therein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic apparatus, comprising:
a system configured to provide a patterned radiation beam;
a substrate table comprising a first support surface configured to support a substrate and a first plurality of grooves disposed on the first support surface;
a projection system configured to project the patterned radiation beam onto a target portion of the substrate; and
a single support stage substrate handler including a first end and a second end that positions the substrate with respect to the substrate table and loads at the first end and/or unloads at the second end the substrate on/from the substrate table, the substrate handler comprising a second support surface configured to support the substrate in a support plane, a conveyor device that moves the substrate in a direction substantially parallel to the support plane, the conveyor device comprising,
a gripping device that moves the substrate in the direction, wherein the gripping device comprises a plurality of movable vacuum fingers located in a respective second plurality of grooves disposed on the second support surface, the second plurality of grooves aligned with the respective first plurality of grooves such that the movable vacuum fingers extend into the respective first plurality of grooves when the substrate is loaded and/or unloaded on/from the substrate table.

2. The lithographic apparatus of claim 1, wherein the gripping device, during gripping of the substrate, contacts only one side of the substrate.

3. The lithographic apparatus of claim 1, wherein the substrate handler is configured to provide an air bed on which the substrate is supported.

4. The lithographic apparatus of claim 1, wherein the substrate comprises a flat panel display.

5. The lithographic apparatus of claim 1, wherein the substrate handler simultaneously loads and/or unloads two or more substrates on/from the substrate handler.

6. A device manufacturing method, comprising:
projecting a patterned beam of radiation onto a substrate;
supporting the substrate, during the projection step, on a first support surface with a first plurality of grooves disposed thereon;
loading, at a first end of a single support stage substrate handler, and/or unloading, at a second end of the substrate handler, the substrate on/from the first support surface;
supporting, with the substrate handler, the substrate on a second support surface with a second plurality of grooves disposed thereon, wherein the second plurality of grooves is aligned with the respective first plurality of grooves;
moving, with a conveyor device, the substrate in a direction substantially parallel to the support plane; and
pushing or pulling, with a gripping device, the substrate in the direction, wherein the gripping device comprises a plurality of movable vacuum fingers located in the respective second plurality of grooves, the movable vacuum fingers configured to extend into the respective first plurality of grooves when the substrate is loading and/or unloading on/from the first support surface.

7. The device manufacturing method of claim 6, further comprising providing an air bed, with a friction reducing device, on which the substrate is supported.

8. The device manufacturing method of claim 6, wherein the pushing or the pulling of the substrate comprises contacting one side of the substrate.

9. The device manufacturing method of claim 6, wherein the loading and/or unloading of the substrate on/from the substrate support comprises simultaneously loading and/or unloading two or more substrates on/from the substrate handler.

* * * * *